US012294367B2

(12) United States Patent
Lo et al.

(10) Patent No.: US 12,294,367 B2
(45) Date of Patent: May 6, 2025

(54) LEVEL SHIFTER WITH VOLTAGE STRESS DURABILITY AND METHOD FOR DRIVING THE SAME

(71) Applicant: eMemory Technology Inc., Hsinchu (TW)

(72) Inventors: Chun-Yuan Lo, Hsinchu County (TW); Wu-Chang Chang, Hsinchu County (TW); Bo-Chang Li, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 49 days.

(21) Appl. No.: 18/366,682

(22) Filed: Aug. 8, 2023

(65) Prior Publication Data

US 2024/0056080 A1  Feb. 15, 2024

Related U.S. Application Data

(60) Provisional application No. 63/397,394, filed on Aug. 12, 2022.

(51) Int. Cl.
| | |
|---|---|
| *H03K 19/01* | (2006.01) |
| *G11C 16/10* | (2006.01) |
| *G11C 16/32* | (2006.01) |
| *G11C 16/34* | (2006.01) |
| *H03K 19/0185* | (2006.01) |

(52) U.S. Cl.
CPC ... *H03K 19/018528* (2013.01); *G11C 16/102* (2013.01); *G11C 16/32* (2013.01); *G11C 16/3459* (2013.01)

(58) Field of Classification Search
CPC .............................................. H03K 19/018528
USPC ....................................... 327/333; 326/62–68
See application file for complete search history.

(56) References Cited

U.S. PATENT DOCUMENTS

| | | | | |
|---|---|---|---|---|
| 5,821,800 | A * | 10/1998 | Le ......................... | H03K 17/102 327/437 |
| 6,002,290 | A * | 12/1999 | Avery ................ | H03K 17/04123 326/62 |
| 7,388,403 | B1 * | 6/2008 | Yang ................... | H03K 3/35613 326/82 |
| 9,882,566 | B1 | 1/2018 | Po et al. | |
| 2021/0384866 | A1 * | 12/2021 | Wilson .................... | H01L 23/66 |

* cited by examiner

*Primary Examiner* — Daniel C Puentes
(74) *Attorney, Agent, or Firm* — CKC & Partners Co., LLC (57) ABSTRACT

A level shifter includes a cross-coupled transistor pair, first through third biased transistor pairs and a differential input pair sequentially coupled in series, and further includes a sub level shifter. The first biased transistor pair is controlled by a first reference voltage. The second biased transistor pair is controlled by a pair of differential control voltages. The third biased transistor pair is controlled by a second reference voltage lower than the first reference voltage. The differential input pair is controlled by a pair of differential input voltages. The sub level shifter generates the differential control voltages according to the differential input voltages and the first and second reference voltages. The differential control voltages are switched between the first and second reference voltages. The level shifter outputs a pair of differential output voltages through inverted and non-inverted output terminals coupled with the second biased transistor pair.

17 Claims, 6 Drawing Sheets

LEVEL SHIFTER WITH VOLTAGE STRESS DURABILITY AND METHOD FOR DRIVING THE SAME

RELATED APPLICATIONS

This application claims priority to U.S. Provisional Application Ser. No. 63/397,394, filed Aug. 12, 2022, which is herein incorporated by reference in its entirety.

BACKGROUND

Technical Field

The present disclosure relates to a level shifter and a driving method. More particularly, the present disclosure relates to a level shifter with voltage stress durability and a method for driving the same.

Description of Related Art

Level shifters are used in the integrated circuits to bridge different voltage domains, that is, to convert signals from a low voltage to a high voltage. Row decoders and column decoders of a memory driving circuit used to write and read data to and from memory cells are driven by voltages provided by the level shifters. For example, each stage of a tree decoder relies upon the voltages from the level shifter to conduct or switch off the switches of such stage. Since the stages of the tree decoder are driven sequentially, the level shifter supplying voltages to the first stage of the tree decoder suffers from the long-term voltage stress and ages the most. In particular, the long-term voltage stress causes the threshold voltage of the transistors of the level shifter to increase, which may induce malfunction of the level shifter.

SUMMARY

The present disclosure provides a level shifter including a first cross-coupled transistor pair, a first biased transistor pair, a second biased transistor pair, a third biased transistor pair, a first differential input pair and a first sub level shifter. The first cross-coupled transistor pair is coupled with a first power terminal. The first biased transistor pair is coupled in series with the first cross-coupled transistor pair, and controlled by a first reference voltage. The second biased transistor pair is coupled in series with the first biased transistor pair, and controlled by a pair of first differential control voltages. The third biased transistor pair is coupled in series with the second biased transistor pair, and controlled by a second reference voltage lower than the first reference voltage. The first differential input pair is coupled in series with the third biased transistor pair, and controlled by a pair of differential input voltages. The first sub level shifter is configured to generate the pair of first differential control voltages according to the pair of differential input voltages, the first reference voltage and the second reference voltage. The pair of first differential control voltages is switched between the first reference voltage and the second reference voltage. The level shifter is configured to output a pair of differential output voltages through an inverted output terminal and a non-inverted output terminal coupled with the second biased transistor pair.

The present disclosure provides a method for driving a level shifter. The level shifter includes a first cross-coupled transistor pair, a first biased transistor pair, a second biased transistor pair, a third biased transistor pair and a first differential input pair sequentially coupled in series. The method includes the following steps: receiving a pair of differential input voltages by the first differential input pair; controlling the first biased transistor pair by a first reference voltage; using a first sub level shifter of the level shifter to generate at least a pair of differential control voltages according to the pair of differential input voltages, the first reference voltage and a second reference voltage; controlling the second biased transistor pair by the at least a pair of differential control voltages; controlling the third biased transistor pair by the second reference voltage lower than the first reference voltage; and outputting a pair of differential output voltages through an inverted output terminal and a non-inverted output terminal coupled with the second biased transistor pair. A phase of the at least a pair of differential control voltages is switched with a phase switching of the pair of differential input voltages.

It is to be understood that both the foregoing general description and the following detailed description are by examples, and are intended to provide further explanation of the disclosure as claimed.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
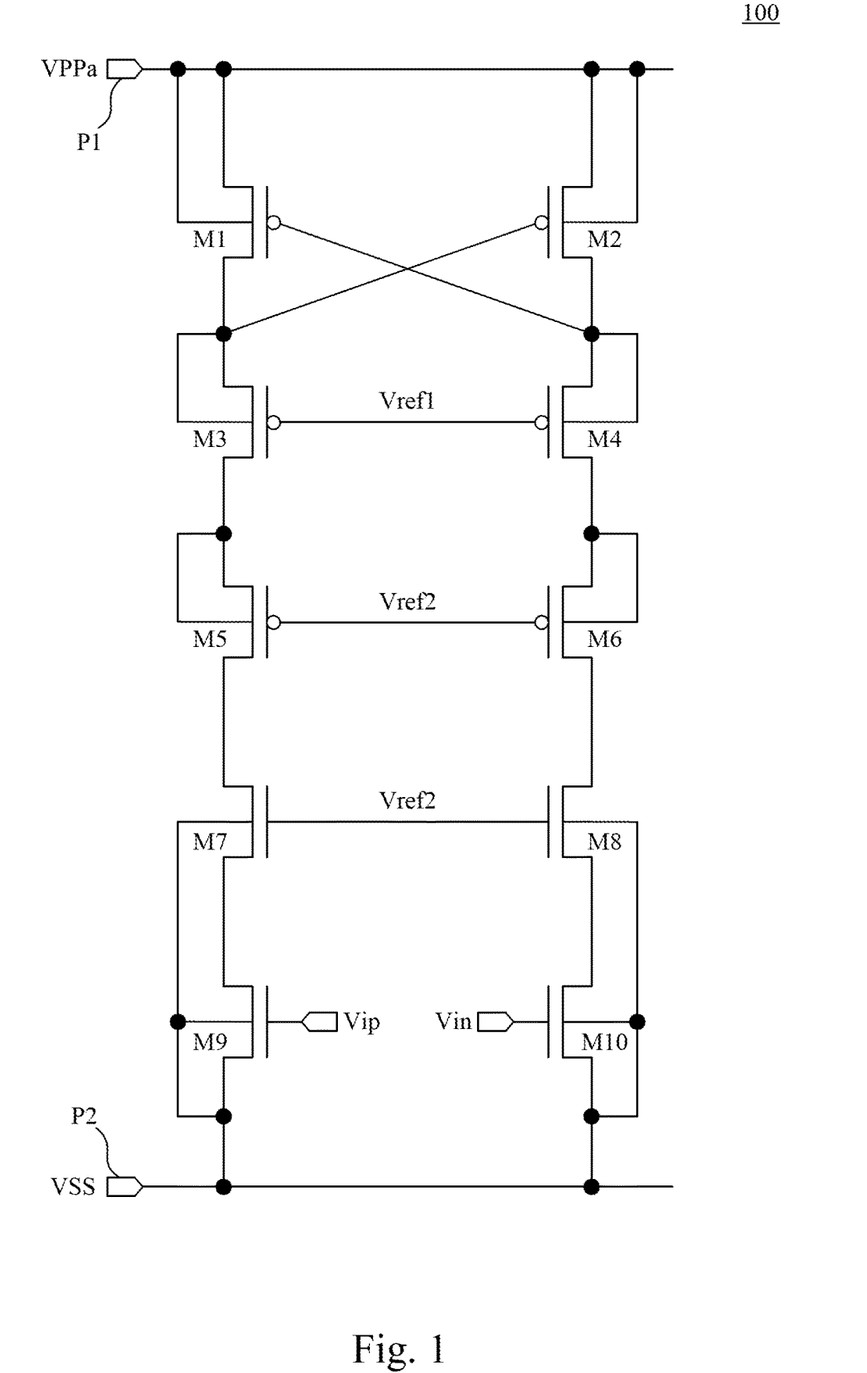
FIG. 1 is a schematic diagram of a level shifter according to one embodiment of the present disclosure.

FIG. 1 is a schematic diagram of a level shifter 100 according to one embodiment of the present disclosure. The level shifter 100 comprises transistors M1-M10, and configured to receive an operating voltage VPPa and an operating voltage VSS from a first power terminal P1 and a second power terminal P2, respectively. The level shifter 100 is also configured to receive a reference voltage Vref1, a reference voltage Vref2 and a pair of differential input voltages (e.g., a non-inverted input voltage Vip and an inverted input voltage Vin). The voltages received by the level shifter 100, from high to low, are the operating voltage VPPa (e.g., 22.5 V), the reference voltage Vref1 (e.g., 15 V), the reference voltage Vref2 (e.g., 7.5 V) and the operating voltage VSS (e.g., 0 V).

The non-inverted input voltage Vip and the inverted input voltage Vin may varies between the reference voltage Vref2 and the operating voltage VSS. For example, when the non-inverted input voltage Vip is 0 V, the inverted input voltage Vin is 5 V, and vice versa. The level shifter 100 may convert the non-inverted input voltage Vip and the inverted input voltage Vin to differential output voltages (not shown in FIG. 1) between the operating voltage VPPa and the reference voltage Vref2.

In one embodiment that the non-inverted input voltage Vip is 0 V and the inverted input voltage Vin is 5 V, the voltage at the source of the transistor M5 may approximate to the operating voltage VPPa (e.g., 22.5 V). Therefore, the transistor M5 receives a great voltage stress (e.g., 22.5 V−7.5V=15 V), which may cause the threshold voltage (Vth) of the transistor M5 to increase after a long-term operation, and cause the current flowing through the transistors M1, M3 and M5 to decrease. As such, the voltage at the source of the transistor M3 and the gate of the transistor M2 increase more slowly than normal situation, and a leakage current may flow through the transistor M2 which pulls down the operating voltage VPPa. A charge pump (not shown in FIG. 1) would not be able to supply the operating voltage VPPa stably or would result in higher power consumption.

Figure 2:
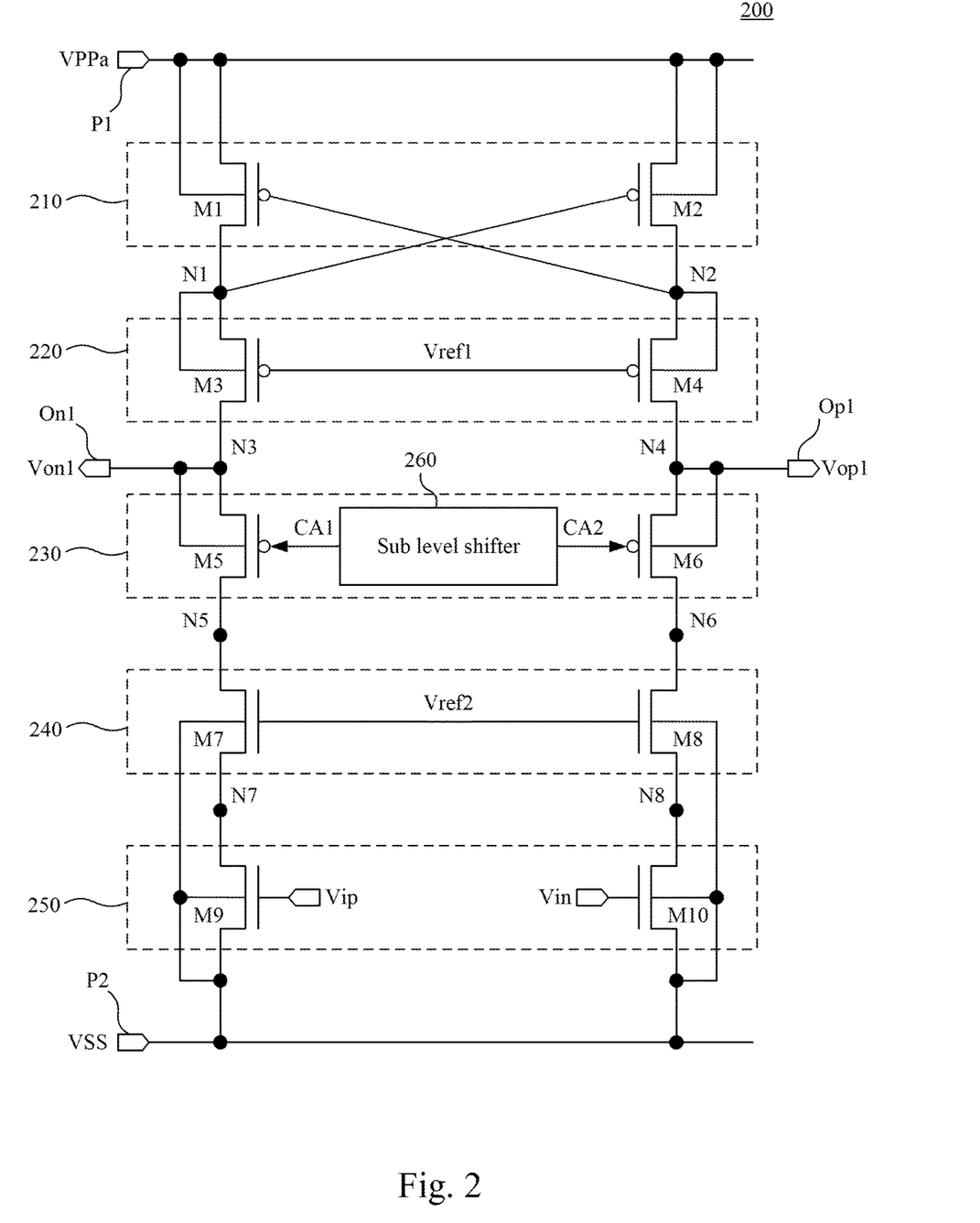
FIG. 2 is a schematic diagram of a level shifter according to one embodiment of the present disclosure.

FIG. 2 is a schematic diagram of a level shifter 200 according to one embodiment of the present disclosure. The level shifter 200 comprises a cross-coupled transistor pair 210, a biased transistor pair 220, a biased transistor pair 230, a biased transistor pair 240, a differential input pair 250, which are sequentially coupled in series. The level shifter 200 further comprises a sub level shifter 260. The level shifter 200 is configured to convert the non-inverted input voltage Vip and the inverted input voltage Vin to differential output voltages (e.g., to a non-inverted output voltage Vop1 and an inverted output voltage Von1, respectively), according to the operating voltage VPPa, the operating voltage VSS, the reference voltage Vref1 and the reference voltage Vref2.

The inverted output voltage Von1 and the non-inverted output voltage Vop1 of the level shifter 200 may be respectively outputted from an inverted output terminal On1 and a non-inverted output terminal Op1, where the inverted output terminal On1 and the non-inverted output terminal Op1 are coupled with the biased transistor pair 230 through nodes N3 and N4, respectively, but this disclosure is not limited thereto. In some embodiments, the inverted output voltage Von1 may be obtained from any one of the nodes N1, N3 and N5, and the non-inverted output voltage Vop1 may be obtained from any one of the nodes N2, N4 and N6. The operating voltage VPPa, the operating voltage VSS, the reference voltage Vref1, the reference voltage Vref2, the non-inverted input voltages Vip and the inverted input voltage Vin are similar to those discussed with reference to FIG. 1, and therefore the detailed descriptions thereof are omitted.

The cross-coupled transistor pair 210 comprises a transistor M1 and a transistor M2. In some embodiments, the transistors M1 and M2 may be implemented using P-type transistors. A first terminal (e.g., the source) and a second terminal (e.g., the drain) of the transistor M1 are coupled with the first power terminal P1 and the node N1, respectively, in which the first power terminal P1 is configured to provide the operating voltage VPPa. A first terminal (e.g., the source) and a second terminal (e.g., the drain) of the transistor M2 are coupled with the first power terminal P1 and the node N2, respectively. A control terminal (e.g., the gate) of the transistor M1 and a control terminal (e.g., the gate) of the transistor M2 are coupled with the nodes N2 and N1, respectively. In some embodiments, the bodies of the transistors M1 and M2 are coupled with the first power terminal P1.

The biased transistor pair 220 is coupled in series with the cross-coupled transistor pair 210, through the nodes N1 and N2. The biased transistor pair 220 comprises a transistor M3 and a transistor M4. In some embodiments, the transistors M3 and M4 may be implemented using P-type transistors. A first terminal (e.g., the source) and a second terminal (e.g., the drain) of the transistor M3 are coupled with the nodes N1 and N3, respectively. A first terminal (e.g., the source) and a second terminal (e.g., the drain) of the transistor M4 are coupled with the nodes N2 and N4, respectively. A control terminal (e.g., the gate) of the transistor M3 and a control terminal (e.g., the gate) of the transistor M4 are configured to receive the reference voltage Vref1. In some embodiments, the bodies of the transistors M3 and M4 are coupled with the nodes N1 and N2, respectively.

The biased transistor pair 220 is controlled by the reference voltage Vref1. In specific, the reference voltage Vref1 determines the conduction degree of the transistors M3 and M4, thereby limiting voltages of the nodes N1 and N2 to not lower than the reference voltage Vref1.

The biased transistor pair 230 is coupled in series with the biased transistor pair 220, through the nodes N3 and N4. The biased transistor pair 230 comprises a transistor M5 and a transistor M6. In some embodiments, the transistors M5 and M6 may be implemented using P-type transistors. A first terminal (e.g., the source) and a second terminal (e.g., the drain) of the transistor M5 are coupled with the nodes N3 and N5, respectively. A first terminal (e.g., the source) and a second terminal (e.g., the drain) of the transistor M6 are coupled with the nodes N4 and N6, respectively. A control terminal (e.g., the gate) of the transistor M5 and a control terminal (e.g., the gate) of the transistor M6 are configured to receive a pair of differential control voltages CA1 and CA2, respectively. In some embodiments, the bodies of the transistors M5 and M6 are coupled with the nodes N3 and N4, respectively.

The biased transistor pair 240 is coupled in series with the biased transistor pair 230, through the nodes N5 and N6. The biased transistor pair 240 comprises a transistor M7 and a transistor M8. In some embodiments, the transistors M7 and M8 may be implemented using N-type transistors. More specifically, the transistors M7 and M8 may be laterally-diffused N-type metal-oxide semiconductor (LDNMOS) transistors. A first terminal (e.g., the drain) and a second terminal (e.g., the source) of the transistor M7 are coupled with the nodes N5 and N7, respectively. A first terminal (e.g., the drain) and a second terminal (e.g., the source) of the transistor M8 are coupled with the nodes N6 and N8, respectively. A control terminal (e.g., the gate) of the transistor M7 and a control terminal (e.g., the gate) of the transistor M8 are configured to receive the reference voltage Vref2. In some embodiments, the bodies of the transistors M7 and M8 are coupled with the second power terminal P2, in which the second power terminal P2 is configured to provide the operating voltage VSS.

The biased transistor pair 240 is controlled by the reference voltage Vref2. In specific, the reference voltage Vref2 determines the conduction degree of the transistors M7 and M8, thereby limiting voltages of the nodes N7 and N8 to not higher than the reference voltage Vref2.

The differential input pair 250 is coupled in series with the biased transistor pair 240, through the nodes N7 and N8. The differential input pair 250 comprises a transistor M9 and a transistor M10. In some embodiments, the transistors M9 and M10 may be implemented using N-type transistors. A first terminal (e.g., the drain) and a second terminal (e.g., the source) of the transistor M9 are coupled with the node N7 and the second power terminal P2, respectively. A first terminal (e.g., the drain) and a second terminal (e.g., the source) of the transistor M10 are coupled with the node N8 and the second power terminal P2, respectively. A control terminal (e.g., the gate) of the transistor M9 and a control terminal (e.g., the gate) of the transistor M10 are configured to receive the non-inverted input voltage Vip and the inverted input voltage Vin, respectively. In other words, the differential input pair 250 is controlled by the differential input voltages (e.g., the non-inverted input voltage Vip and the inverted input voltage Vin). In some embodiments, the bodies of the transistor M9 and the transistor M10 are coupled with the second power terminal P2.

The sub level shifter 260 is configured to generate the differential control voltages CA1 and CA2, according to the differential input voltages Vin and Vip, the reference voltage Vref1 and the reference voltage Vref2, which will be discussed in great detail with reference to FIG. 3. The differential control voltages CA1 and CA2 are switched between the reference voltage Vref1 and the reference voltage Vref2. For example, when the control voltage CA1 is set to the reference voltage Vref1 (e.g., 15 V), the control voltage CA2 is set to the reference voltage Vref2 (e.g., 7.5 V), and vice versa.

The differential control voltages CA1 and CA2 are configured to control the biased transistor pair 230. In specific, the differential control voltages CA1 and CA2 are configured to ensure the normal operation of the transistors M5 and M6 instead of being breakdown. As such, the voltages of the nodes N3 and N4 are limited to not lower than the reference voltage Vref2, that is, the control voltages CA1 and CA2 are configured to respectively control magnitude of the inverted output voltage Von1 and magnitude of the non-inverted output voltage Vop1 to not lower than the reference voltage Vref2.

In addition, phases of the differential control voltages CA1 and CA2 are opposite to phases of the differential input voltages Vip and Vin, respectively. In specific, the control voltage (e.g., the control voltage CA1) and the input voltage (e.g., the input voltage Vip) corresponding to the same output voltage (e.g., the output voltage Von1) have opposite phases.

For example, when the non-inverted input voltage Vip (e.g., 5 V) is higher than the inverted input voltage Vin (e.g., 0 V), the control voltage CA1 (e.g, 7.5 V) is lower than the control voltage CA2 (e.g., 15 V). In this situation, the non-inverted output voltage Vop1 approximates to the operating voltage VPPa (e.g., 22.5V) and the inverted output voltage Von1 approximates to control voltage CA1 (e.g., 7.5V).

As another example, when the non-inverted input voltage Vip (e.g., 0V) is lower than the inverted input voltage Vin (e.g., 5 V), the control voltage CA1 (e.g., 15 V) is higher than the control voltage CA2 (e.g., 7.5 V). In this situation, the non-inverted output voltage Vop1 approximates to the control voltage CA2 (e.g., 7.5V) and the inverted output voltage Von1 approximates to the operating voltage VPPa (e.g., 22.5V). Accordingly, the phases of the differential control voltages CA1 and CA2 are switched with the phase switching of the differential input voltages (e.g., the non-inverted input voltage Vip and the inverted input voltage Vin).

In the embodiment that the operating voltage VPPa is 22.5 V, the maximum source-gate voltage difference of the transistors M5 and M6 are reduced from 15 V (i.e., 22.5 V-7.5 V) to 7.5 V (i.e., 22.5 V-15 V), as compared with the level shifter 100 of FIG. 1. As a result, the threshold voltages of the transistors M5 and M6 remain stable after the long-term usage, thereby guaranteeing the voltage stress durability of the level shifter 200.

Figure 3:
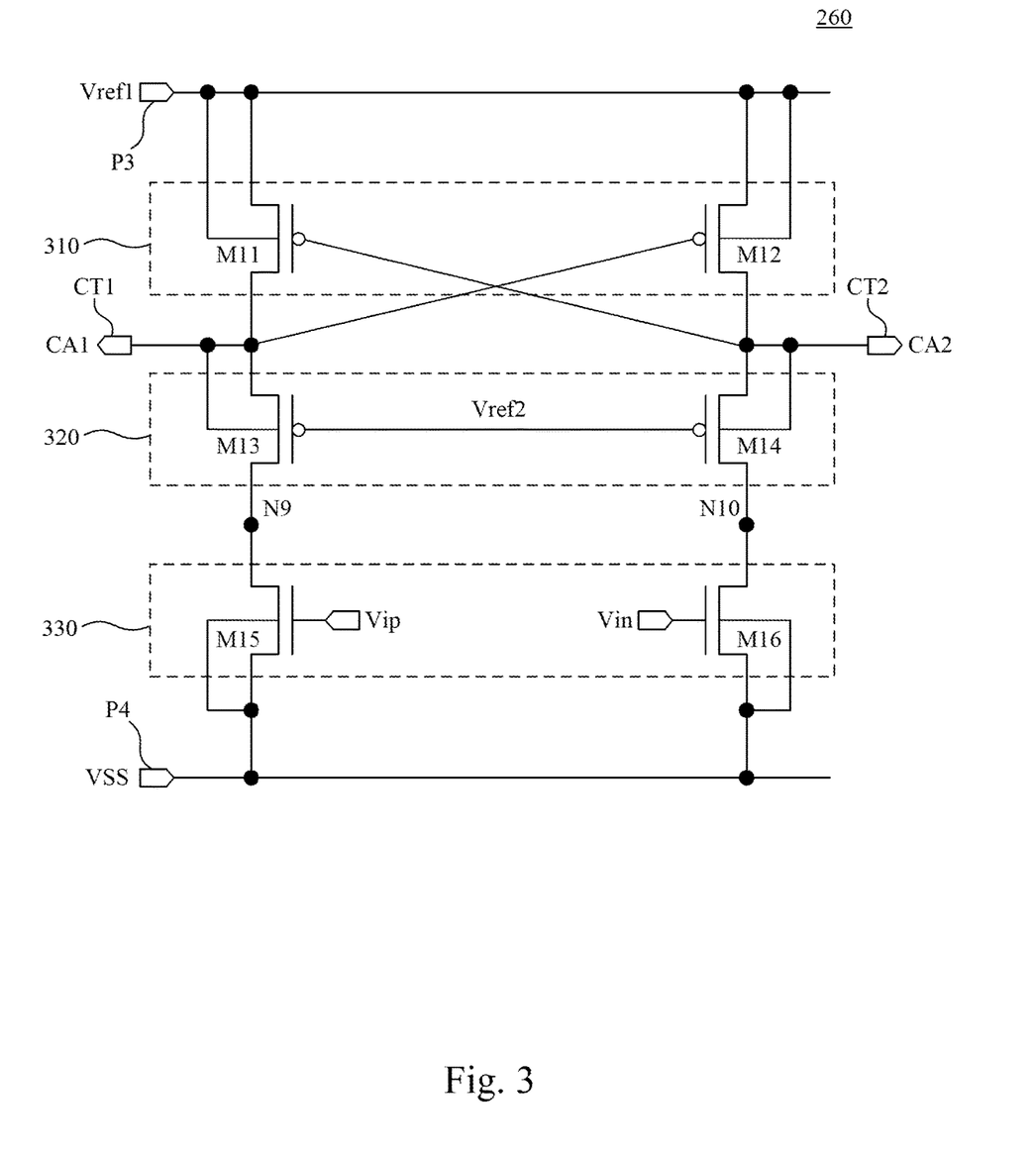
FIG. 3 is a schematic diagram of a sub level shifter according to one embodiment of the present disclosure.

FIG. 3 is a schematic diagram of the sub level shifter 260 according to one embodiment of the present disclosure. The sub level shifter 260 comprises a cross-coupled transistor pair 310, a biased transistor pair 320 and a differential input pair 330, which are sequentially coupled in series.

The cross-coupled transistor pair 310 comprises a transistor M11 and a transistor M12. In some embodiments, the transistors M11 and M12 may be implemented using P-type transistors. A first terminal (e.g., the source) and a second terminal (e.g., the drain) of the transistor M11 are coupled to a third power terminal P3 and a control terminal CT1, respectively. A first terminal (e.g., the source) and a second terminal (e.g., the drain) of the transistor M12 are coupled to the third power terminal P3 and a control terminal CT2, respectively. A control terminal (e.g., the gate) of the transistor M11 and a control terminal of the transistor M12 are coupled to the control terminals CT2 and CT1, respectively. The third power terminal P3 is configured to provide the reference voltage Vref1. The differential control terminals CT1 and CT2 are configured to provide the differential control voltages CA1 and CA2, respectively. In some embodiments, bodies of the transistors M11 an M12 are coupled to the third power terminal P3.

The biased transistor pair 320 comprises a transistor M13 and a transistor M14. In some embodiments, the transistors M13 and M14 may be implemented by using P-type transistors. A first terminal (e.g., the source) and a second terminal (e.g., the drain) of the transistor M13 are coupled to the control terminal CT1 and a node N9, respectively. A first terminal (e.g., the source) and a second terminal (e.g., the drain) of the transistor M14 are coupled to the control terminal CT2 and a node N10, respectively. A control terminal (e.g., the gate) of the transistor M13 and a control terminal of the transistor M14 are configured to receive the reference voltage Vref2. In some embodiments, bodies of the transistors M13 an M14 are coupled to the control terminals CT1 and CT2, respectively.

The differential input pair 330 comprises a transistor M15 and a transistor M16. In some embodiments, the transistors M15 and M16 may be implemented using N-type transistors. A first terminal (e.g., the drain) and a second terminal (e.g., the source) of the transistor M15 are coupled to the node N9 and a fourth power terminal P4, respectively. A first terminal (e.g., the drain) and a second terminal (e.g., the source) of the transistor M16 are coupled to the node N10 and the fourth power terminal P4, respectively. A control terminal (e.g., the gate) of the transistor M15 and a control terminal of the transistor M16 are configured to receive the input voltages Vip and Vin, respectively. The fourth power terminal P4 is configured to provide the operating voltage VSS. In some embodiments, bodies of the transistors M15 an M16 are coupled to the fourth power terminal P4.

Figure 4:
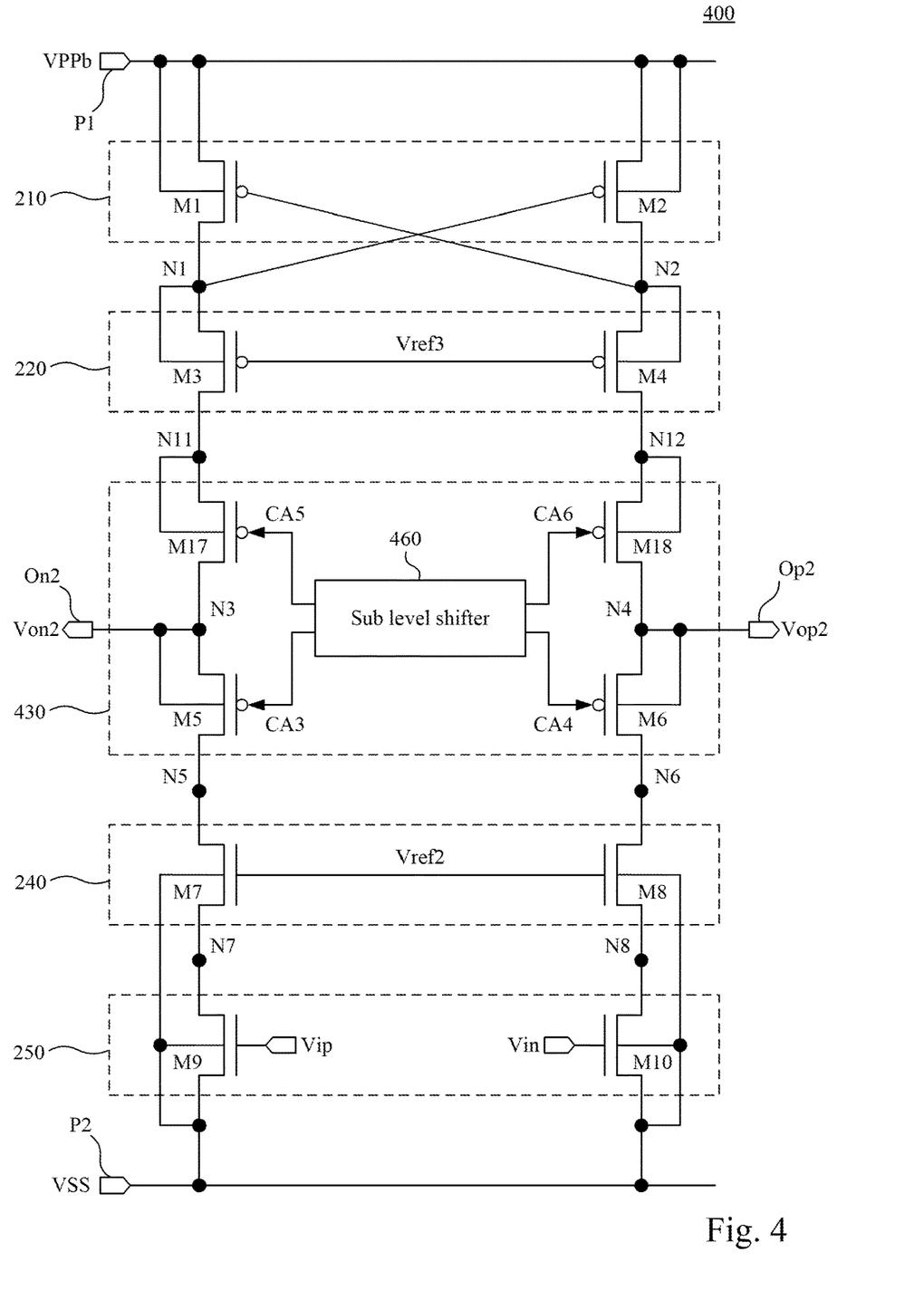
FIG. 4 is a schematic diagram of a level shifter according to one embodiment of the present disclosure.

FIG. 4 is a schematic diagram of a level shifter 400 according to one embodiment of the present disclosure. The level shifter 400 of FIG. 4 is similar to the level shifter 200 of FIG. 2, and therefore only the differences between the level shifters 200 and 400 are discussed in the following paragraphs. As shown in FIG. 4, the cross-coupled transistor pair 210 is configured to receive an operating voltage VPPb (e.g., 30 V) higher than the aforementioned operating voltage VPPa (e.g., 22.5 V). The reference voltage Vref1 for controlling the biased transistor pair 220 is replaced by a higher reference voltage Vref3 (e.g., 22.5 V). The biased transistor pair 230 is replaced by a biased transistor pair 430 comprising a sub level shifter 460. In addition, an inverted output terminal On2 and a non-inverted output terminal Op2 of the level shifter 400 are configured to respectively output a pair of differential output voltages (e.g., an inverted output voltage Von2 and a non-inverted output voltage Vop2), where the inverted output terminal On2 and the non-inverted output terminal Op2 are coupled with the biased transistor pair 430 through the nodes N3 and N4, respectively.

The biased transistor pair 430 is coupled in series with the biased transistor pair 220 through the nodes N11 and N12. The biased transistor pair 430 comprises the transistor M5, the transistor M6, a transistor M17 and a transistor M18. The sub level shifter 460 is coupled with the gates of the transistor M5, M6, M17 and M18, and is configured to generate differential control voltages CA3 and CA4 and differential control voltages CA5 and CA6, according to the non-inverted input voltage Vip, the inverted input voltage Vin, the reference voltage Vref1 and the reference voltage Vref2, so as to control the biased transistor pair 430. In some embodiments, the transistors M5, M6, M17 and M18 may be implemented using P-type transistors.

A first terminal (e.g., the source) and a second terminal (e.g., the drain) of the transistor M5 are coupled with the nodes N3 and N5, respectively. A first terminal (e.g., the source) and a second terminal (e.g., the drain) of the transistor M6 are coupled with the nodes N4 and N6, respectively. Control terminals (e.g., the gates) of the transistors M5 and M6 are configured to respectively receive differential control voltages CA3 and CA4 from the sub level shifter 460. In some embodiments, the bodies of the transistors M5 and M6 are coupled with the nodes N3 and N4, respectively. In some embodiments that the sub level shifter 460 is implemented using the level shifter 200, the gates of the transistors M5 and M6 of the level shifter 400 are coupled with the nodes N3 and N4 of the level shifter 200, respectively, in order to receive the output voltages Von1 and Von2 as the differential control voltages CA3 and CA4.

A first terminal (e.g., the source) and a second terminal (e.g., the drain) of the transistor M17 are coupled with the nodes N11 and N3, respectively. A first terminal (e.g., the source) and a second terminal (e.g., the drain) of the transistor M18 are coupled with the nodes N12 and N4, respectively. Control terminals (e.g., the gates) of the transistors M17 and M18 are configured to respectively receive differential control voltages CA5 and CA6 from the sub level shifter 460. In some embodiments, the bodies of the transistors M17 and M18 are coupled with the nodes N11 and N12, respectively.

The differential control voltages CA3 and CA4 are switched between the reference voltages Vref2 (e.g., 7.5 V) and Vref3 (e.g., 22.5 V). The differential control voltages CA5 and CA6 are switched between the reference voltages Vref1 (e.g., 15 V) and Vref3 (e.g., 22.5 V). The differential control voltages CA3 and CA4 are configured to control the conduction degree of the transistors M5 and M6, and the differential control voltages CA5 and CA6 are configured to control the conduction degree of the transistors M17 and M18. Therefore, the control voltages CA3 and CA5 are configured to control magnitude of the inverted output voltage Von2, and the control voltage CA4 and CA6 are configured to control magnitude of the non-inverted output voltage Vop2.

Phases of the differential control voltages CA3 and CA4 are opposite to phases of the differential input voltages Vip and Vin, respectively. Similarly, phases of the differential control voltages CA5 and CA6 are opposite to phases of the differential input voltages Vip and Vin, respectively.

For example, when the non-inverted input voltage Vip (e.g., 5V) is higher than the inverted input voltage Vin (e.g., 0 V), the control voltage CA3 (e.g., 7.5 V) is lower than the control voltage CA4 (e.g., 22.5 V) and the control voltage CA5 (e.g., 15 V) is lower than the control voltage CA6 (e.g., 22.5 V).

As another example, when the non-inverted input voltages Vip (e.g., 0 V) is lower than the inverted input voltage Vin (e.g., 5 V), the control voltage CA3 (e.g., 22.5 V) is higher than the control voltage CA4 (e.g., 7.5 V) and the control voltage CA5 (e.g., 22.5 V) is higher than the control voltage CA6 (e.g., 15 V). Accordingly, the phase of the differential control voltages CA3 and CA4 and the phase of the differential control voltages CA5 and CA6 are switched with the phase switching of the differential input voltages Vip and Vin.

As a result, the maximum source-gate voltage difference of the transistors M5, M6, M17 and M18 are limited to 7.5 V (i.e., 30 V-22.5 V), so that the transistors M5, M6, M17 and M18 are operated under acceptable voltage stresses.

Figure 5:
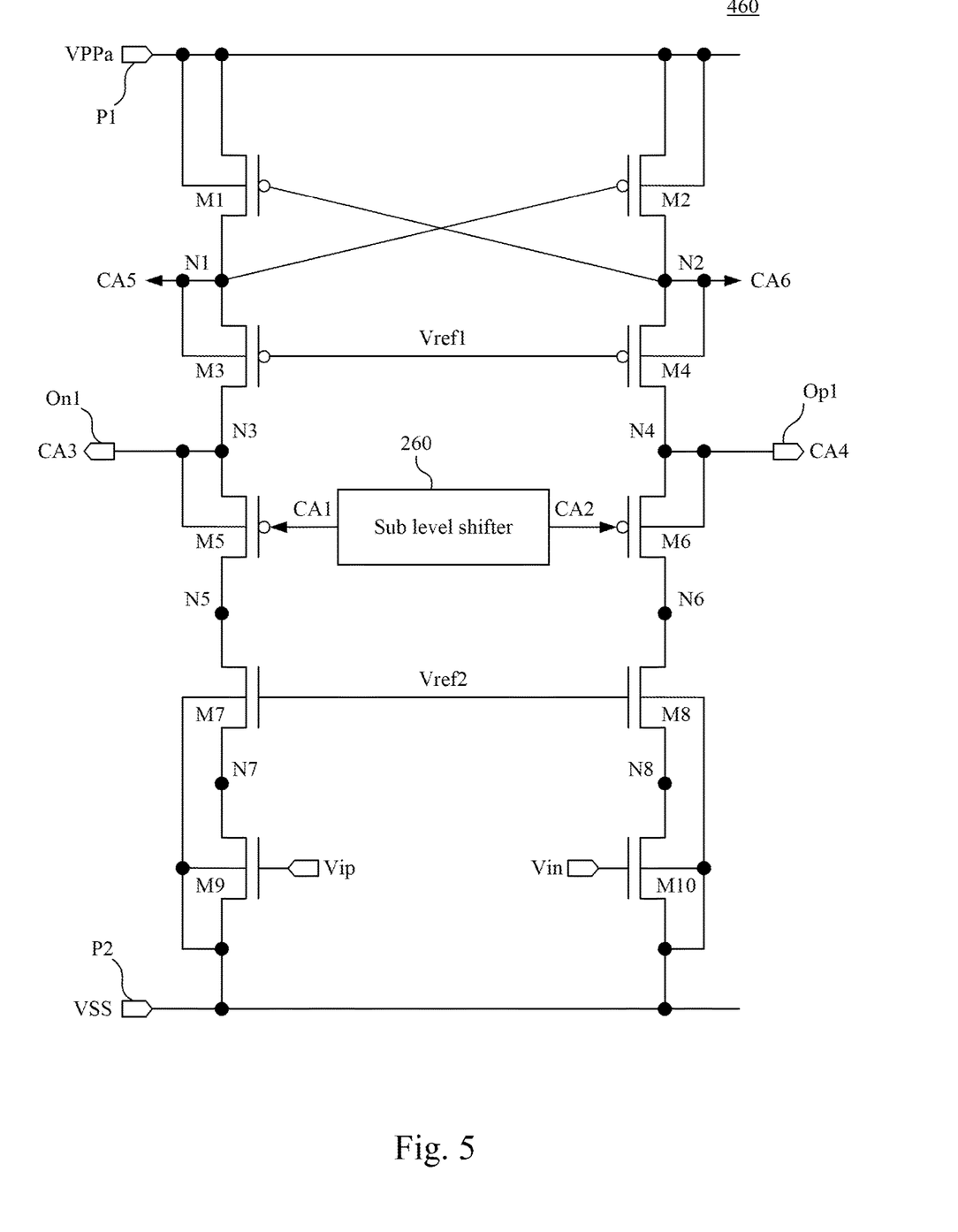
FIG. 5 is a schematic diagram of a sub level shifter according to another embodiment of the present disclosure.

FIG. 5 is a schematic diagram of the sub level shifter 460 according to one embodiment of the present disclosure. The sub level shifter 460 in FIG. 5 is similar to the level shifter 200 of FIG. 2, and therefore only the differences between the level shifter 200 and the sub level shifter 460 are discussed in the following paragraph. The sub level shifter 460 is configured to respectively output the differential control voltages CA3 and CA4 by the nodes N3 and N4 (i.e., the inverted output terminal On1 and the non-inverted output terminal Op1), that is, the inverted output voltage Von1 and the non-inverted output voltage Vop1 of FIG. 2 may be used as the differential control voltages CA3 and CA4. The sub level shifter 460 is further configure to respectively output the differential control voltages CA5 and CA 6 by the nodes N1 and N2.

Figure 6:
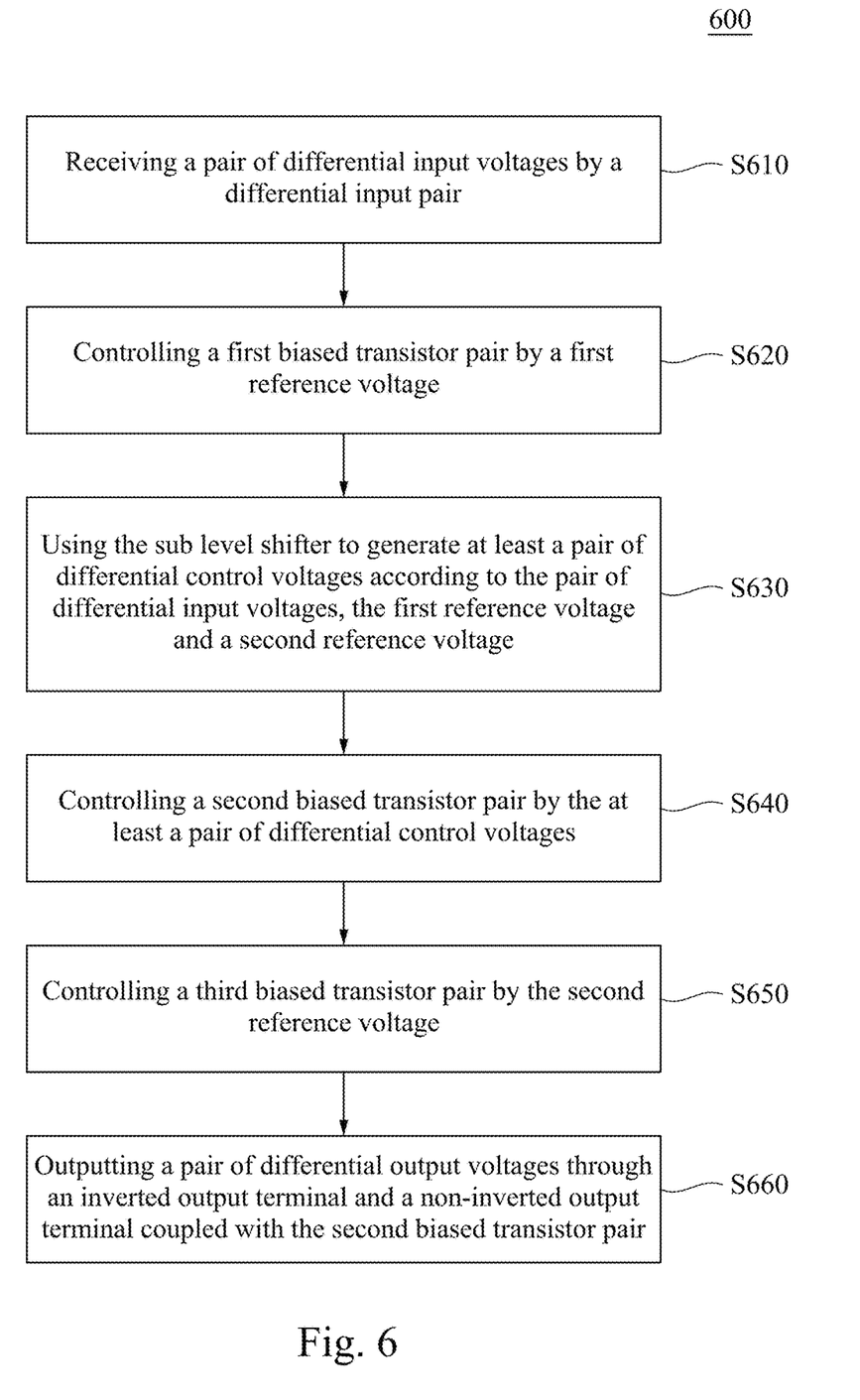
FIG. 6 is a flowchart of a method for driving the level shifter of FIG. 2, according to one embodiment of the present disclosure.

FIG. 6 is a flowchart of a method 600 for driving the level shifter 200 of FIG. 2 and level shifter 400 of FIG. 4, according to one embodiment of the present disclosure. Any combination of the features of the method 600 or any of the other methods described herein may be embodied in instructions stored in a non-transitory computer readable storage medium. When executed, the instructions may cause some or all of such methods to be performed. It will be understood that any of the methods discussed herein may include greater or fewer operations than illustrated in the flowchart and the operations may be performed in any order, as appropriate.

In operation S610, the first differential input pair (e.g., the differential input pair 250) receives the non-inverted input voltage Vip and inverted input voltage Vin.

In operations S620, the first biased transistor pair (e.g., the biased transistor pair 220) is controlled by the first reference voltage (e.g., the reference voltage Vref1 in FIG. 2 or the reference voltage Vref3 in FIG. 4).

In operation S630, the sub level shifter (e.g., the sub level shifter 260 or the sub level shifter 460) generates at least a pair of differential control voltages (e.g., the control voltages CA1 and CA2 in FIG. 2 or the combination of control voltages CA3-CA6 in FIG. 4), according to the non-inveted input voltage Vip and the inverted input voltage Vin, the first reference voltage (e.g., the reference voltage Vref1) and the second reference voltage (e.g., the reference voltage Vref2). In addition, the phase of the at least a pair of differential control voltages is switched with the phase switching of the non-inverted input voltage Vip and the inverted input voltage Vin.

In the embodiment regard to the level shifter 200, operation S630 comprises: receiving the reference voltage Vref1 by the cross-coupled transistor pair 310; controlling the biased transistor pair 320 by the reference voltage Vref2; receiving the differential input voltages Vip and Vin by the differential input pair 330; and providing the differential control voltages CA1 and CA2 by the differential control terminals CT1 and CT2 coupled between the cross-coupled transistor pair 310 and the biased transistor pair 320.

In the embodiment regard to the level shifter 400, operation S630 comprises: receiving the pair of differential input voltages by the differential input pair 250; controlling the biased transistor pair 220 by the reference voltage Vref1; using the sub level shifter 260 to generate the pair of differential control voltages CA1 and CA2, according to the differential input voltages Vip and Vin, the reference voltage Vref1 and the reference voltage Vref2; controlling the biased transistor pair 230 by the pair of differential control voltages CA1 and CA2; controlling the biased transistor pair 240 by the reference voltage Vref2; providing the pair of differential control voltages CA3 and CA4 respectively by nodes N3 and N4 (i.e., the inverting output terminals On1 and non-inverting output terminals Op1) between the biased transistor pair 220 and the biased transistor pair 230; and providing the pair of differential control voltages CA5 and CA6 by nodes N1 and N2 between the cross-coupled transistor pair 210 and the biased transistor pair 220.

In operation S640, the second biased transistor pair (e.g., the biased transistor pair 230 in FIG. 2 or the biased transistor pair 430 in FIG. 4) is controlled by the at least a pair of the differential control voltages.

In operation S650, the third biased transistor pair (e.g., the biased transistor pair 240) is controlled by the second reference voltage (e.g., the reference voltage Vref2).

In operation S660, the level shifter (e.g., the level shifter 200 or 400) outputs a pair of differential output voltages (e.g., the inverted and non-inverted output voltages Von1 and Vop1 of FIG. 2 or the inverted and non-inverted output voltages Von2 and Vop2 of FIG. 4), through an inverted output terminal and a non-inverted output terminal (e.g., the inverted and non-inverted output terminals On1 and Op1 of FIG. 2 or the inverted and non-inverted output terminals On2 and Op2 of FIG. 4) coupled with the second biased transistor pair (e.g., the biased transistor pair 230 of FIG. 2 or the biased transistor pair 430 of FIG. 4).

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A level shifter, comprising:
a first cross-coupled transistor pair, coupled with a first power terminal;
a first biased transistor pair, coupled in series with the first cross-coupled transistor pair, and controlled by a first reference voltage;
a second biased transistor pair, coupled in series with the first biased transistor pair, and controlled by a pair of first differential control voltages;
a third biased transistor pair, coupled in series with the second biased transistor pair, and controlled by a second reference voltage lower than the first reference voltage;
a first differential input pair, coupled in series with the third biased transistor pair, and controlled by a pair of differential input voltages; and
a first sub level shifter, configured to generate the pair of first differential control voltages according to the pair of differential input voltages, the first reference voltage and the second reference voltage, wherein the pair of first differential control voltages is switched between the first reference voltage and the second reference voltage;
wherein the level shifter is configured to output a pair of differential output voltages through an inverted output terminal and a non-inverted output terminal coupled with the second biased transistor pair,
wherein the pair of differential output voltages comprises a non-inverted output voltage and an inverted output voltage,
wherein the pair of differential input voltages comprises a non-inverted input voltage and an inverted input voltage that are converted to the non-inverted output voltage and the inverted output voltage, respectively,
wherein the pair of first differential control voltages comprises a first control voltage and a second control voltage configured to control magnitude of the inverted output voltage and magnitude of the non-inverted output voltage, respectively, and
wherein when the non-inverted input voltage is higher than the inverted input voltage, the first control voltage is lower than the second control voltage.

2. The level shifter of claim 1, wherein the first sub level shifter comprises:
a second cross-coupled transistor pair, configured to receive the first reference voltage;
a fourth biased transistor pair, coupled in series with the second cross-coupled transistor pair through a pair of differential control terminals, and controlled by the second reference voltage, wherein the pair of differential control terminals are configured to provide the pair of first differential control voltages; and
a second differential input pair, coupled in series with the fourth biased transistor pair, and controlled by the pair of differential input voltages.

3. The level shifter of claim 2, wherein the first cross-coupled transistor pair comprises:
a first transistor, coupled between the first power terminal and a first node, wherein a control terminal of the first transistor is coupled with a second node; and
a second transistor, coupled between the first power terminal and the second node, wherein a control terminal of the second transistor is coupled with the first node,
the first cross-coupled transistor pair is coupled in series with the first biased transistor pair through the first node and the second node.

4. The level shifter of claim 3, wherein the first biased transistor pair comprises:
a third transistor, coupled between the first node and a third node; and
a fourth transistor, coupled between the second node and a fourth node, wherein a control terminal of the third transistor and a control terminal of the fourth transistor are configured to receive the first reference voltage,
wherein the first biased transistor pair is coupled in series with the second biased transistor pair through the third node and the fourth node,
wherein the third node and the fourth node are coupled with the inverted output terminal and the non-inverted output terminal, respectively.

5. The level shifter of claim 4, wherein the second biased transistor pair comprises:
a fifth transistor, coupled between the third node and a fifth node; and
a sixth transistor, coupled between the fourth node and a sixth node, wherein a control terminal of the fifth transistor and a control terminal of the sixth transistor are configured to receive the pair of first differential control voltages,
wherein the second biased transistor pair is coupled in series with the third biased transistor pair through the fifth node and the sixth node.

6. The level shifter of claim 5, wherein the third biased transistor pair comprises:
a seventh transistor, coupled between the fifth node and a seventh node; and
an eighth transistor, coupled between the sixth node and an eighth node, wherein a control terminal of the seventh transistor and a control terminal of the eighth transistor are configured to receive the second reference voltage,
wherein the third biased transistor pair is coupled in series with the first differential input pair through the seventh node and the eighth node.

7. The level shifter of claim 6, wherein the seventh transistor and the eighth transistor are laterally-diffused metal-oxide semiconductor (LDMOS) transistors.

8. The level shifter of claim 6, wherein the first differential input pair comprises:
a ninth transistor, coupled between the seventh node and a second power terminal; and
a tenth transistor, coupled between the eighth node and the second power terminal, wherein a control terminal of the ninth transistor and a control terminal of the tenth transistor are configured to receive the pair of differential input voltages.

9. The level shifter of claim 1, wherein the first sub level shifter is further configured to generate a pair of second differential control voltages to control the second biased transistor pair, and the pair of second differential control voltages is switched between the first reference voltage and a third reference voltage.

10. The level shifter of claim 9, wherein the second reference voltage is lower than the third reference voltage, and the third reference voltage is lower than the first reference voltage.

11. The level shifter of claim 10, wherein
the pair of second differential control voltages comprises a third control voltage and a fourth control voltage,
wherein the first control voltage and the third control voltage are configured to control magnitude of the inverted output voltage, and the second control voltage and the fourth control voltage are configured to control magnitude of the non-inverted output voltage,
wherein when the non-inverted input voltage is higher than the inverted input voltage, the third control voltage is lower than the fourth control voltage.

12. The level shifter of claim 10, wherein the first sub level shifter comprises:
a second cross-coupled transistor pair, coupled with the first power terminal;
a fourth biased transistor pair, coupled in series with the second cross-coupled transistor pair, and controlled by the third reference voltage;
a fifth biased transistor pair, coupled in series with the fourth biased transistor pair, and controlled by a pair of third differential control voltages;
a sixth biased transistor pair, coupled in series with the fifth biased transistor pair, and controlled by the second reference voltage;
a second differential input pair, coupled in series with the sixth biased transistor pair, and controlled by the pair of differential input voltages; and
a second sub level shifter, configured to generate the pair of third differential control voltages according to the pair of differential input voltages, the third reference voltage and the second reference voltage, wherein the pair of third differential control voltages is switched between the third reference voltage and the second reference voltage.

13. The level shifter of claim 12, wherein the second sub level shifter comprises:
a third cross-coupled transistor pair, configured to receive the third reference voltage;
a seventh biased transistor pair, coupled in series with the third cross-coupled transistor pair through a pair of differential control terminals, and controlled by the second reference voltage, wherein the pair of differential control terminals are configured to provide the pair of third differential control voltages; and
a third differential input pair, coupled in series with the seventh biased transistor pair, and controlled by the pair of differential input voltages.

14. A method for driving a level shifter comprising a first cross-coupled transistor pair, a first biased transistor pair, a second biased transistor pair, a third biased transistor pair and a first differential input pair sequentially coupled in series, the method comprising:
receiving a pair of differential input voltages by the first differential input pair;
controlling the first biased transistor pair by a first reference voltage;

using a first sub level shifter of the level shifter to generate at least a pair of differential control voltages according to the pair of differential input voltages, the first reference voltage and a second reference voltage;

controlling the second biased transistor pair by the at least a pair of differential control voltages;

controlling the third biased transistor pair by the second reference voltage lower than the first reference voltage; and outputting a pair of differential output voltages through an inverted output terminal and a non-inverted output terminal coupled with the second biased transistor pair, wherein a phase of the at least a pair of differential control voltages is switched with a phase switching of the pair of differential input voltages, wherein the pair of differential output voltages comprises a non-inverted output voltage and an inverted output voltage, wherein the pair of differential input voltages comprises a non-inverted input voltage and an inverted input voltage that are converted to the non-inverted output voltage and the inverted output voltage, respectively, wherein the at least a pair of differential control voltages comprises a pair of first differential control voltages comprising a first control voltage and a second control voltage, and the first control voltage and the second control voltage are configured to control magnitude of the inverted output voltage and magnitude of the non-inverted output voltage, respectively, and wherein when the non-inverted input voltage is higher than the inverted input voltage, the first control voltage is lower than the second control voltage.

15. The method of claim 14, wherein the first sub level shifter comprises a second cross-coupled transistor pair, a fourth biased transistor pair and a second differential input pair sequentially coupled in series, wherein using the first sub level shifter of the level shifter to generate the at least a pair of differential control voltages comprises:

receiving the first reference voltage by the second cross-coupled transistor pair;

controlling the fourth biased transistor pair by the second reference voltage;

receiving the pair of differential input voltages by the second differential input pair; and providing the pair of first differential control voltages of the at least a pair of differential control voltages by a pair of differential control terminals coupled between the second cross-coupled transistor pair and the fourth biased transistor pair.

16. The method of claim 14, wherein the first sub level shifter comprises a second cross-coupled transistor pair, a fourth biased transistor pair, a fifth biased transistor pair, a sixth biased transistor pair, a second differential input pair and a second sub level shifter, wherein using the first sub level shifter of the level shifter to generate the at least a pair of differential control voltages comprises:

receiving the pair of differential input voltages by the second differential input pair;

controlling the fourth biased transistor pair by a third reference voltage;

using the second sub level shifter of the level shifter to generate a pair of second differential control voltages, according to the pair of differential input voltages, the third reference voltage and the second reference voltage;

controlling the fifth biased transistor pair by the pair of second differential control voltages;

controlling the third biased transistor pair by the second reference voltage;

providing the pair of first differential control voltages of the at least a pair of differential control voltages by nodes between the fourth biased transistor pair and the fifth biased transistor pair; and providing a pair of third differential control voltages of the at least a pair of differential control voltages by nodes between the second cross-coupled transistor pair and the fourth biased transistor pair.

17. A level shifter, comprising:

a first cross-coupled transistor pair, coupled with a first power terminal;

a first biased transistor pair, coupled in series with the first cross-coupled transistor pair, and controlled by a first reference voltage;

a second biased transistor pair, coupled in series with the first biased transistor pair, and controlled by a pair of first differential control voltages;

a third biased transistor pair, coupled in series with the second biased transistor pair, and controlled by a second reference voltage lower than the first reference voltage;

a first differential input pair, coupled in series with the third biased transistor pair, and controlled by a pair of differential input voltages; and a first sub level shifter, configured to generate the pair of first differential control voltages according to the pair of differential input voltages, the first reference voltage and the second reference voltage, wherein the first sub level shifter comprises:

a second cross-coupled transistor pair, configured to receive the first reference voltage, and comprising a first transistor and a second transistor, wherein:

the first transistor is coupled between a third power terminal and a first control terminal of the pair of differential control terminals, a second control terminal of the pair of differential control terminals is coupled with a control terminal of the first transistor, and the third power terminal is configured to provide the first reference voltage;

the second transistor is coupled between the third power terminal and the second control terminal, the first control terminal is coupled with a control terminal of the second transistor, and the first control terminal and the second control terminal are configured to provide the pair of first differential control voltages, a fourth biased transistor pair, coupled in series with the second cross-coupled transistor pair through the pair of differential control terminals, controlled by the second reference voltage, and comprising a third transistor and a fourth transistor, wherein:

the third transistor is coupled between the first control terminal and a first node; and the fourth transistor is coupled between the second control terminal and a second node, wherein a control terminal of the third transistor and a control terminal of the fourth transistor are configured to receive the second reference voltage;

a second differential input pair, coupled in series with the fourth biased transistor pair, controlled by the pair of differential input voltages, and comprising a fifth transistor and a sixth transistor, wherein:

the fifth transistor is coupled between the first node and a fourth power terminal; and the sixth transistor is coupled between the second node and the fourth power terminal, and a control terminal of the fifth transistor and a control terminal of the sixth transistor are configured to receive the pair of differential input voltages, wherein the pair of first differential control voltages is switched between the first reference voltage and the second reference voltage, wherein the level shifter is configured to output a pair of differential output voltages through an inverted output terminal and a non-inverted output terminal coupled with the second biased transistor pair.

* * * * *